US008445179B2

(12) United States Patent
Maessen et al.

(10) Patent No.: US 8,445,179 B2

(45) Date of Patent: May 21, 2013

(54) METHOD FOR TREATING A LITHOGRAPHIC PRINTING PLATE

(75) Inventors: Peter Maessen, 's-Hertogenbosch (NL); Hubertus Van Aert, Pulderbos (BE)

(73) Assignee: Agfa Graphics NV, Mortsel (BE)

( * ) Notice: Subject to any disclaimer, the term of this patent is extended or adjusted under 35 U.S.C. 154(b) by 351 days.

(21) Appl. No.: 12/598,608

(22) PCT Filed: Jun. 10, 2008

(86) PCT No.: PCT/EP2008/057204

§ 371 (c)(1), (2), (4) Date: Nov. 3, 2009

(87) PCT Pub. No.: WO2008/152028

PCT Pub. Date: Dec. 18, 2008

(65) Prior Publication Data

US 2010/0137180 A1 Jun. 3, 2010

Related U.S. Application Data

(60) Provisional application No. 60/943,882, filed on Jun. 14, 2007.

(30) Foreign Application Priority Data

Jun. 13, 2007 (EP) .................................... 07110156

(51) Int. Cl.

*G03F 7/26* (2006.01)
*G03F 7/40* (2006.01)
*B41B 1/08* (2006.01)

(52) U.S. Cl.

USPC ........ 430/302; 430/300; 101/453; 101/463.1; 101/456; 101/457

(58) Field of Classification Search

USPC ............... 430/300, 302; 101/453, 463.1, 456, 101/457

See application file for complete search history.

(56) References Cited

U.S. PATENT DOCUMENTS

| | | | | |
|---|---|---|---|---|
| 4,504,406 | A | 3/1985 | Dhillon | |
| 4,576,743 | A | 3/1986 | Kita et al. | |
| 4,762,772 | A * | 8/1988 | Kobayashi et al. | 430/309 |
| 5,002,857 | A * | 3/1991 | Toyama et al. | 430/300 |
| 5,726,230 | A * | 3/1998 | Murata et al. | 524/308 |
| 6,716,569 | B2 * | 4/2004 | Hotta et al. | 430/302 |

FOREIGN PATENT DOCUMENTS

| | | | |
|---|---|---|---|
| EP | 0 620 125 | A1 | 10/1994 |
| EP | 0 625 728 | A2 | 11/1994 |
| EP | 0 770 494 | A2 | 5/1997 |
| EP | 0 770 495 | A1 | 5/1997 |
| EP | 0 770 496 | A1 | 5/1997 |
| EP | 0 770 497 | A1 | 5/1997 |
| EP | 0 823 327 | A2 | 2/1998 |
| EP | 0 864 420 | A1 | 9/1998 |
| EP | 0 894 622 | A2 | 2/1999 |
| EP | 0 901 902 | A2 | 3/1999 |
| EP | 0 825 927 | B1 | 8/1999 |
| EP | 0 985 546 | A1 | 3/2000 |
| EP | 1 356 949 | A1 | 10/2003 |
| EP | 1 602 982 | A2 | 12/2005 |
| GB | 2 276 729 | A | 10/1994 |

OTHER PUBLICATIONS

"Polyglycerol Esters of Fatty Acids", published in 1990 and 1992.*

Tomoharu, K. , Takeshi, N., Masatsugu, Y., Masami, K., Tadaya, K., Takahito, I.—Surfactant Properties of Purified Polyglycerol Monolaurates, Journal of Surfactants and Detergents, vol. 6, No. 4, Oct. 2003.*

Official Communication issued in International Patent Application No. PCT/EP2008/057204, mailed on Nov. 6, 2008.

* cited by examiner

*Primary Examiner* — Anca Eoff

(74) *Attorney, Agent, or Firm* — Keating & Bennett, LLP

(57) ABSTRACT

A method for treating a lithographic printing plate including the step of applying a liquid containing a surfactant to the plate, characterized in that the surfactant includes at least one hydrophilic segment including polyglycerol, and at least one hydrophobic segment selected from an optionally substituted alkylene group, an alkyl or aryl substituted poly(meth)acrylate, an optionally substituted polyester, polyether, polyurethane, polycarbosilane, polysiloxane, polystyrene and/or a polymer including a perfluoroalkyl group with the proviso that the liquid is not applied as a fountain solution.

8 Claims, No Drawings

METHOD FOR TREATING A LITHOGRAPHIC PRINTING PLATE

CROSS-REFERENCE TO RELATED APPLICATIONS

This application is a 371 National Stage Application of PCT/EP2008/057204, filed Jun. 10, 2008. This application claims the benefit of U.S. Provisional Application No. 60/943,882, filed Jun. 14, 2007, which is incorporated by reference herein in its entirety. In addition, this application claims the benefit of European Application No. 07110156.2, filed Jun. 13, 2007, which is also incorporated by reference herein in its entirety.

BACKGROUND OF THE INVENTION

1. Field of the Invention

The present invention relates to a method for treating a lithographic printing plate.

2. Description of the Related Art

Lithographic printing presses use a so-called printing master such as a printing plate which is mounted on a cylinder of the printing press. The master carries a lithographic image on its surface and a print is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called a plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e., without the use of a film mask. The material is exposed to heat or to infrared light and the generated heat triggers a (physico-) chemical process, such as ablation, polymerization, insolubilization by cross linking of a polymer, heat-induced solubilization or particle coagulation of a thermoplastic polymer latex.

The most popular thermal plates form an image by a heat-induced solubility difference in an alkaline developer between exposed and non-exposed areas of the coating. The coating typically includes an oleophilic binder, e.g., a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g., EP-A 625728, 823327, 825927, 864420, 894622 and 901902. Negative working preferred embodiments of such thermal materials often require a pre-heat step between exposure and development as described in e.g., EP-625,728.

Negative working plate precursors which do not require a pre-heat step may contain an image-recording layer that works by heat-induced particle coalescence of a thermoplastic polymer particle (latex), as described in e.g., EP-As 770 494, 770 495, 770 496 and 770 497. These patents disclose a method for making a lithographic printing plate including the steps of (1) image-wise exposing an imaging element including hydrophobic thermoplastic polymer particles dispersed in a hydrophilic binder and a compound capable of converting light into heat, (2) and developing the image-wise exposed element by applying fountain and/or ink.

Some of these thermal processes enable plate making without wet processing and are for example based on ablation of one or more layers of the coating. At the exposed areas the surface of an underlying layer is revealed which has a different affinity towards ink or fountain than the surface of the unexposed coating.

Other thermal processes which enable plate making without wet processing are for example processes based on a heat-induced hydrophilic/oleophilic conversion of one or more layers of the coating so that at exposed areas a different affinity towards ink or fountain is created than at the surface of the unexposed coating.

U.S. Pat. No. 4,576,743 discloses a plate cleaner including an aqueous solution containing a silicate and at least one surface active agent selected from a cationic or an amphoteric surface active agent.

EP 620 125 discloses a printing assistant for lithographic printing plates including a water-soluble hemicellulose compound derived from soyabean.

EP 1 356 949 provides a correction fluid for lithographic printing plates including a carbonic acid ester, a specified amide compound and compounds consisting of fluorocarboxylic acids, hydrogen fluoride alkaline compounds, fluoroalkaline compounds, and hydrofluoric acids of a metal belonging to Group 4 of Periodic Table.

EP 985 546 discloses a plate surface protective agent and a fountain solution composition for a lithographic printing plate each including a polyoxyethylene polyoxypropylene block copolymer.

Before, during and after the printing step, a lithographic printing plate is in general treated with various liquids for improving the lithographic properties of the image and non-image areas. Such liquids are applied for example to improve the hydrophilic properties of the non-image areas and to protect, restore or even enhance the hydrophobicity of the image areas. It is of high importance that these fluids, commonly referred to as plate treating liquids, do not deteriorate the image and/or the non-image areas throughout and well after their application. However, depending on the time of contact between the image areas and these chemicals, it has been observed that the image areas become thinner and that the aluminum substrate underneath even becomes visible. This disturbs the printed image in such a way that the press life—i.e., the number of acceptable printed copies that can be made with this plate—and/or the shelf life of the plate diminishes considerably after contact with such treating liquids. Especially the chemical resistance towards several treating liquids of the image areas of a printing plate based on a heat-induced solubility difference in an alkaline developer, is often insufficient. In addition, it is known in the art that the ink acceptance of the image areas—i.e., the so-called roll-up performance—is often reduced upon treating the plate with treating liquids of the prior art. Also, it has been observed that such a treatment drastically reduces the hydrophobicity of the image-areas, this reduction being known in the art as blinding. The reduction in roll-up performance and the blinding phenomenon are even more pronounced upon storage of the treated plate and as a result, the shelf life of the plate decreases.

SUMMARY OF THE INVENTION

In order to overcome the problems described above, preferred embodiments of the present invention provide a method for improving the lithographic quality of a printing plate without affecting the image areas and/or reducing the shelf life of the plate. The lithographic quality of a printing plate is determined by lithographic properties such as for example hydrophilicity of non-image areas, hydrophobicity of image areas, lithographic latitude, staining and/or scumming resistance. Areas having hydrophilic properties means that these areas have a higher affinity for an aqueous solution than for an oleophilic ink; areas having hydrophobic properties means that these areas have a higher affinity for an oleophilic ink than for an aqueous solution.

According to a preferred embodiment of the present invention, a method for treating a lithographic printing plate includes the step of applying a liquid containing a surfactant to the plate, characterized in that the surfactant includes at least one hydrophilic segment including polyglycerol, and at least one hydrophobic segment selected from an optionally substituted alkylene group, an alkyl or aryl substituted poly (meth)acrylate, an optionally substituted polyester, polyether, polyurethane, polycarbosilane, polysiloxane, polystyrene and/or a polymer including a perfluoroalkyl group with the proviso that the liquid is not applied as a fountain solution.

It was surprisingly found that the image areas of a printing plate are unaffected by the treatment of the plate with a liquid including a surfactant having a hydrophilic part containing polyglycerol, compared to such treating fluids of the prior art containing other surfactants. It was found that especially treating fluids containing surfactants with a hydrophilic segment including ethyleneoxide units severely attack the image areas of a printing plate.

Other features, elements, steps, characteristics and advantages of the present invention will become more apparent from the following detailed description of preferred embodiments of the present invention.

DETAILED DESCRIPTION OF THE PREFERRED EMBODIMENTS

The liquid used in the preferred embodiments of the present invention includes a surfactant which includes at least one hydrophilic segment which contains polyglycerol, and at least one hydrophobic (or oleophilic) segment. With hydrophilic segments is meant that these segments have a higher affinity for an aqueous liquid or phase than for an oleophilic liquid or phase, and with hydrophobic segments is meant that these segments have a higher affinity for an oleophilic liquid or phase than for an aqueous liquid or phase.

Polyglycerol is defined herein as a polymer containing at least two units independently selected from the two chemical structures I and II given below. Thus, polyglycerol may contain two units I, two units II, one unit I and one unit II, and any further combination of these structures with units I and/or II.

(I)

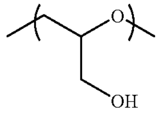

(II)

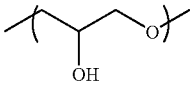

Polyglycerol is a branched polymer and can be produced by for example ringopening polymerization of glycidol (see structure III below) with an alcohol, whereby two hydroxyl end groups are generated which can each subsequently react with additional glycidol molecules and/or with oxiranes such as for example ethylene oxide, propylene oxide, butylene oxide, styrene oxide, cyclopentene oxide, cyclohexene oxide, carbon dioxide, 1,3-dioxolane (IV), allyl glycidyl ether (V), (2,2-dimethyl-1,3-dioxolan-4-yl)methyl acetate (VI), 3-ethyl-3-oxetanemethanol (VII), α,2,2-trimethyl-1,3-dioxane-5-acetic acid (VIII), 1,3,5-trioxepane (IX) and 4-oxiranyl-benzoic acid (X).

(III)

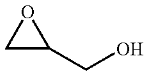

(IV)

(V)

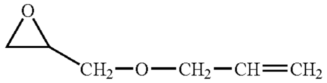

(VI)

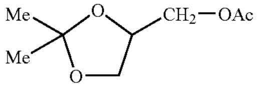

(VII)

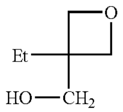

(VIII)

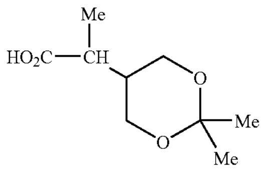

(IX)

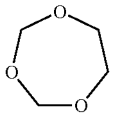

(X)

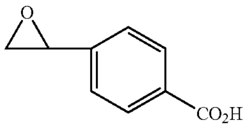

Depending on the polymerization conditions, the degree of branching and/or the microstructure of the hydrophilic segment containing polyglycerol can be modified. Synthetic methods for the production of polyglycerol are known in the art such as for example in the following references: Synthesis of hydroxypolyethers via ring opening polymerization; Vandenberg E. J. et al.; Polymer Preprints (1984), 25(1), 253-4 and Cationic polymerization of glycidol; Tokar R. et al.; Macromolecules (1994), 2(2), 320-2.

Polyglycerol can optionally be substituted with for example an alkyl group, a cycloalkyl group, —COOH, —$CH_2$—COOH, —$SO_3H$, —$SO_4H$, —$PO_3H_2$, —CO-alkyl, —CO-aryl, —CO-heteroaryl, a phenyl group, a benzyl group and/or or a salts and/or combinations thereof. The substituents may be present at the end of the polyglycerol segment and/or within the polyglycerol segment. Upon phosphatation of the polyglycerol, mono-esters, di-esters and/or mixtures of both may be formed.

Polyglycerol containing two, three or more of the glycerol units I and/or II can be represented by many structural formulae. The more glycerol units the polyglycerol contains, the more structural formulae become possible. For example, polyglycerol containing two glycerol units—i.e., a diglycerol such as diglycerol lauryl ether—can be represented by two structural formulae (see structures COM-IV (1) and COM-IV (2) below), whereas polyglycerol containing three glycerol units—i.e., a triglycerol such as triglycerol lauryl ether—may be represented by five structural formulae (see structures COM-V (1) to COM-V (5) below).

Furthermore, the hydrophilic segment containing polyglycerol may, depending on the reaction conditions and/or specific preparation mode, be substituted with one hydrophobic segment (mono-substituted polyglycerol surfactant) or with more than one hydrophobic segment (multi-substituted polyglycerol surfactant). Indeed, triglycerol for example, is a polyglycerol with three units I and/or II and has multiple OH-groups on to which a reaction can occur. The degree of reaction depends on the weight ratio of the reagentia—i.e., triglycerol and hydrophobic segment containing product: if for example an excess of two equivalents of hydrophobic segment containing product is added to triglycerol, a mixture of products—i.e., unsubstituted polyglycerol, mono-substituted polyglycerol, polyglycerol substituted with two hydrophobic groups, polyglycerol substituted with three hydrophobic groups, and/or polyglycerol substituted with more than three hydrophobic groups are formed. Moreover, triglycerol is a mixture of 6 different isomers—i.e., products with the same molecular formula but with a different structural formula—and in addition to that contains small amounts of other oligomers such as glycerol, diglycerol and tetraglycerol. As a result, many reaction products will be formed and the exact composition of multi-substituted polyglycerol surfactants is often difficult to determine. Parameters such as saponification value, average esterification value (ratio), and HLB (hydrophylic-lipophylic balance) are often used in the art to characterize these surfactants.

Mono-substituted polyglycerol surfactants such as di-block copolymers and multi-substituted polyglycerol surfactants such as tri-block copolymers and multi-block copolymers can be represented by the following schematic structures:

mono-substituted surfactant:

di-block copolymers:

multi-substituted surfactant:

tri-block copolymers:

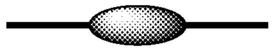

multi-block copolymers:

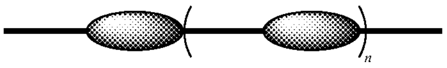

Multi-substituted polyglycerol also includes graft-copolymers, star-branched copolymers and multi-arm star copolymers and may be represented by many schematic structures. An example of a graft and star-branched copolymer is given below—the elliptical shape and the straight lines can represent either the polyglycerol segment or the hydrophobic segment:

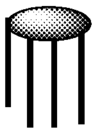

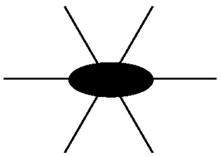

The hydrophobic segment preferably included in the surfactant, is selected from an optionally substituted straight or branched alkylene group, which has a number of carbon atoms preferably ranging from 4 to 50, more preferably ranging from 8 to 30 and most preferably 10 to 25; or a polymer selected from an optionally substituted polyester, an optionally substituted polyether, an optionally substituted polycarbosilane, an optionally substituted polyurethane, an optionally substituted polysiloxane such as phenylalkylsiloxanes and dialkylsiloxanes, e.g., phenylmethylsiloxanes and dimethylsiloxanes, an optionally substituted polymer including a perfluoroalkyl group, an alkyl or aryl substituted poly(meth) acrylate and/or an optionally substituted polystyrene.

The alkyl group present on the alkyl substituted poly(meth) acrylates is preferably selected from methyl, ethyl, propyl, isopropyl, butyl, tertiary butyl, etc. The aryl group is preferably selected from a phenyl, tolyl, xylyl group, etc.

The optional substituents present on the straight, or branched alkylene group represent a halogen such as a chlorine or bromine atom, a hydroxyl group, an amino group, an optionally substituted aryl or heteroaryl group, a (di)alkylamino group, an alkoxy group and a carboxyl group.

The optional substituents on the polyester, polyether, polycarbosilane, polyurethane, polysiloxane, polystyrene and polymer including a perfluoroalkyl group, may be selected from an alkyl group, a halogen such as a chlorine or bromine atom, a hydroxyl group, an amino group, a (di)alkylamino group, an alkoxy group or a carboxyl group.

Specific examples of suitable hydrophobic segments include butyryl, caproyl, caprylyl, capryl, lauryl, myristyl, palmityl, stearyl, isostearyl, nonyl phenol and polyhydroxy polyester.

The hydrophilic segment is coupled with the hydrophobic segment via a spacer group. This spacer group is selected from an ester, ether, urethane, amide, carbonate, sulfonamide, amine and a thioether linking group. Most preferably, the linking group is an ether or an ester group.

In a preferred embodiment, the liquid according to a preferred embodiment of the present invention contains monoalkyl or multi-alkyl substituted polyglycerol ethers. These surfactants can for example be prepared by reaction of an aliphatic or aromatic alcohol with glycidol (structure III above). Various modes of synthesis of polyglycerol alkyl ethers are described in detail in the art and can for example be found in the following references: JP 1 131 504 3, JP 2001 114 720, WO 9 309 214 and DE 2 425 681. Specific modes of synthesis for polyglycerol alkyl ethers include for example:

- ringopening polymerization of glycidol using an alkylalcohol whereby at least two alcohol end groups are formed (scheme 1, reaction 1);
- heating alkyl-glycerol generating polyglycerol ethers with more than one alkyl chain (scheme 1, reaction 2);
- reaction of polyglycerol with alkyloxirane (scheme 1, reaction 3).

Scheme 1: examples of preparation of polyglycerol ethers.

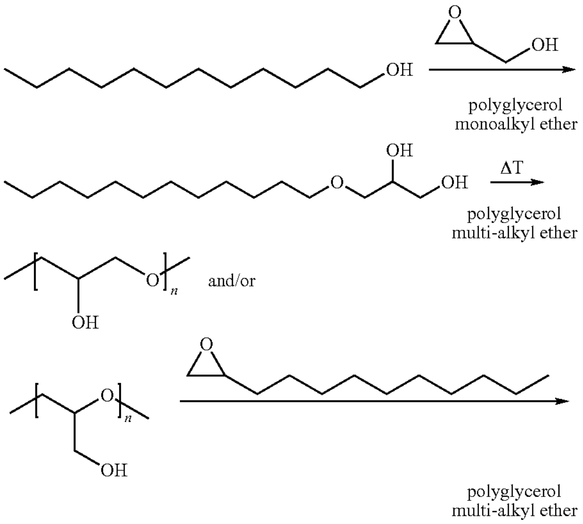

wherein n and m are independently selected from 0 or an integer >0 with the proviso that $n+m \geqq 2$.

In a second highly preferred embodiment, the treating liquid used in the present invention contains polyglycerol ester surfactants. Examples of preparation methods of polyglycerol esters are for example described in the following references: DE 10 251 984, U.S. Pat. No. 4,950,441, DE 3 818 293, JP 07 206 767, DE 4 420 516, JP 4 178 316, DE 102005019548, EP 1 502 644, DE 19 524 210 and WO 2002/036534.

Polyglycerol esters can for example be obtained by an esterification reaction of one or more fatty acid molecules with polyglycerol. Besides fatty acids, also mono- or multifunctional carboxylates can react with polyglycerol generating segmented block or multi-block copolymers. Multi-functional carboxylates include for example carboxylates containing more than one carboxylic acid group such as for example bis carboxy terminated polyesters and/or carboxylates containing besides one or more carboxylate groups other functional groups such as for example a hydroxyl group. The carboxylic acid end groups of hydroxy terminated polyesters, for example poly(hydroxy)stearic acid, can react with the hydroxyl groups of polyglycerol yielding di-block or star-branched segmented copolymers. Alternatively, the hydroxy end group can react with glycidol generating di-block copolymers. Thus, depending on the preparation method various types of segmented copolymers based on polyglycerol and polyester can be prepared.

Polyglycerol esters and polyglycerol ethers are preferred surfactants and more specifically, alkyl polyglycerol esters and alkyl polyglycerol ethers are highly preferred. Other suitable polymeric polyglycerol esters are the products disclosed in the following references: Amphiphilic hyperbranched-hyperbranched block copolymers based on polycarbosilane and polyglycerol: Schuele, Hanna; Nieberle, Joerg; Frey, Holger, PMSE Preprints (2007), 96 252-253; Preparation of star-shaped ABC copolymers of polystyrene-poly(ethylene oxide)-polyglycidol using ethoxyethyl glycidyl ether as the cap molecule: Wang, Guowei; Huang, Junlian, The Key Laboratory of Molecular Engineering of Polymers, Department of Macromolecular Science, State Education Ministry of China, Fudan University, Shanghai, Peop. Rep. China, Macromolecular Rapid Communications (2007), 28(3), 298-304; Multi-arm star polyglycerol-block-poly(tert-butyl acrylate) and the respective multi-arm poly(acrylic acid) stars: Shen, Zhong; Chen, Yu; Barriau, Emilie; Frey, Holger, Institut fuer Organische Chemie, Johannes Gutenberg-Universitaet, Mainz, Germany, Macromolecular Chemistry and Physics (2006), 207(1), 57-64; Linear-hyperbranched amphiphilic AB diblock copolymers based on polystyrene and hyperbranched polyglycerol: Barriau, Emilie; Marcos, Alejandra Garcia; Kautz, Holger; Frey, Holger, Institute of Organic Chemistry, Organic and Macromolecular Chemistry, Johannes Gutenberg-University of Mainz, Mainz, Germany; Macromolecular Rapid Communications (2005), 26(11), 862-867; Linear-hyperbranched nonionic PPO-polyglycerol surfactants: Kautz, Holger; Istratov, Vladislav; Kim, Yong-Keun; Schubert, Rolf; Frey, Holger, Department of Organic Chemistry, University of Mainz, Mainz, Germany, Polymer Preprints (American Chemical Society, Division of Polymer Chemistry) (2003), 44(1), 526-527; Synthesis of poly(glycerol)-block-poly(methyl acrylate) multi-arm star polymers: Maier, Steffen; Sunder, Alexander; Frey, Holger; Mulhaupt, Rolf, Freiburger Materialforschungszentum FMF and Institut fur Makromolekulare Chemie, Albert-Ludwigs-Universitat, Freiburg, Germany, Macromolecular Rapid Communications (2000), 21(5), 226-230.

In a specific preferred embodiment, the surfactant can be prepared by ringopening copolymerization of glycidol with a hydrophobic modified oxirane selected from 2-methyl-2-undecyl-4-hydroxymethyl-1,3-dioxolane (XI), 2-decyl-oxirane (XII), 3-(2,2,2-trifluoroethoxymethyl)-3-methyloxetane (XIII), 3-methyl-3-[[(3,3,4,4,5,5,6,6,6-nonafluorohexyl) oxy]methyl]-oxetane (XIV), 3-methyl-3-(2,2,3,3,3-pentafluoropropoxymethyl)oxetane (XV).

-continued
(XI)
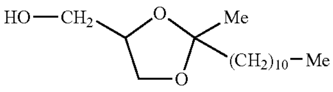
(XII)
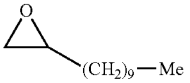
(XIII)
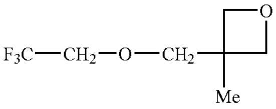
(XIV)
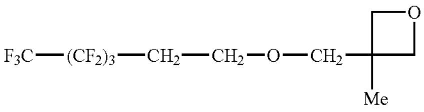
(XV)
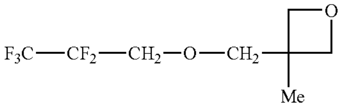
Specific examples of suitable surfactants for preferred embodiments of the present invention are for example the following structures:
polyglycerol mono lauryl ester:
COM-I
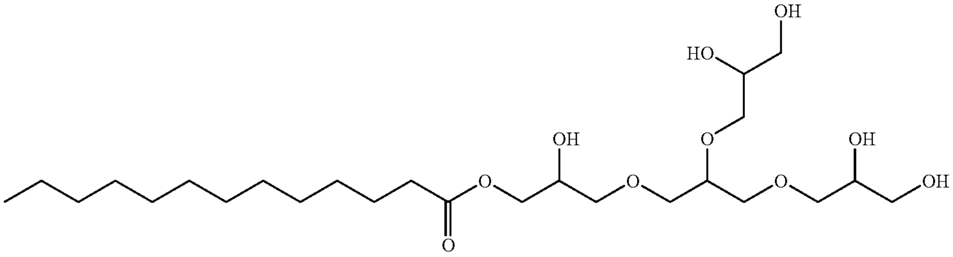
polyglycerol dilauryl ester:
COM-II
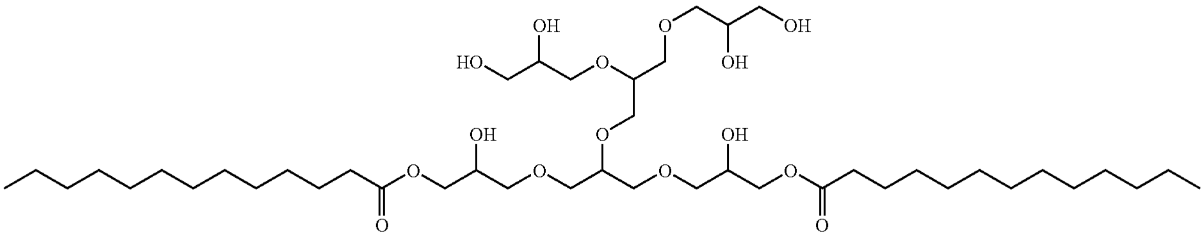
triglycerine diisostearate represented by the following formulae:
COM-III (1)
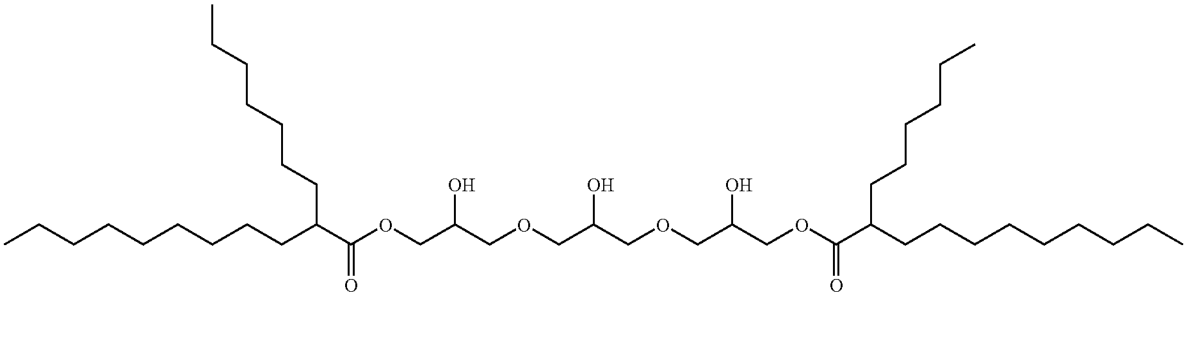

-continued
COM-III (2)
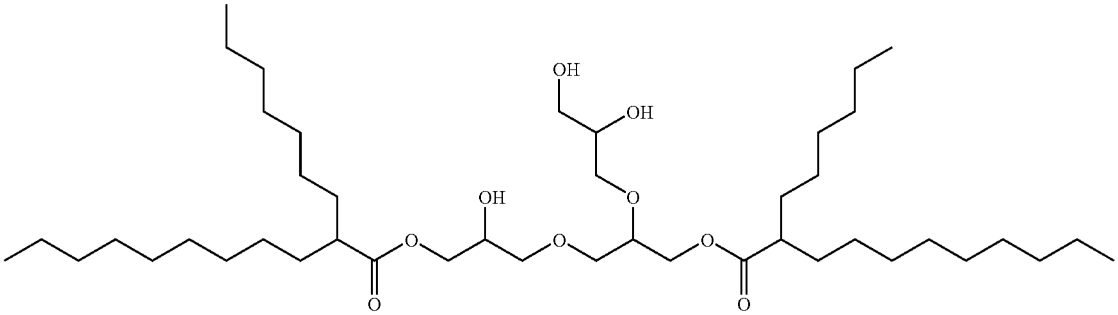
COM-III (3)
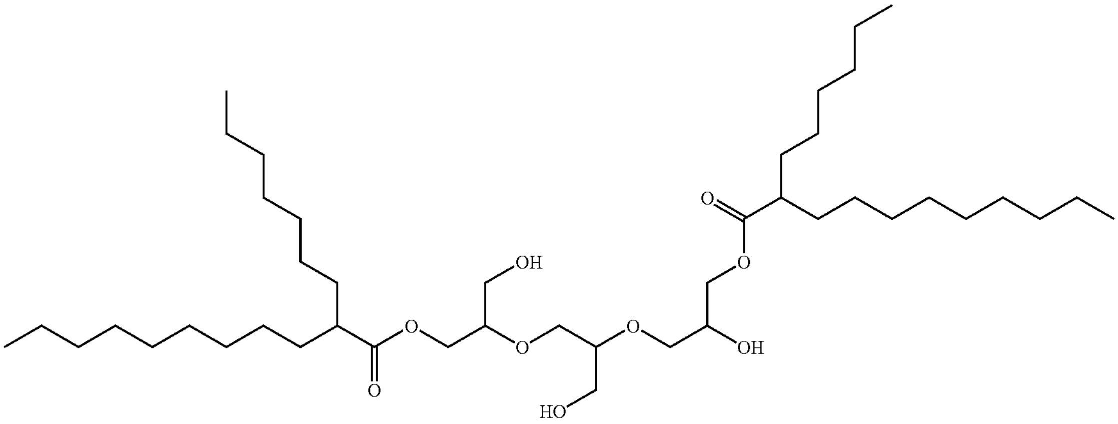
lauryl-(glycerol)$_2$ or diglycerol lauryl ether represented by the following formulae:
COM-IV (1)
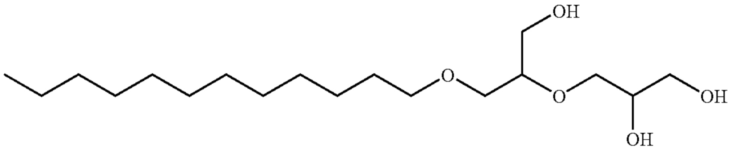
COM-IV (2)
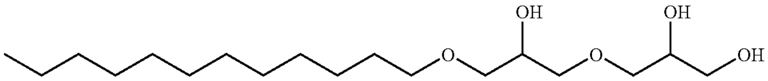
triglycerol lauryl ether represented by the following formulae COM-V (1) to COM-V (5):
COM-V (1)
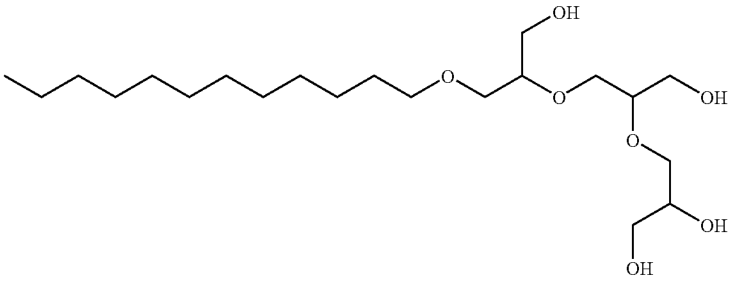

-continued
COM-V (2)
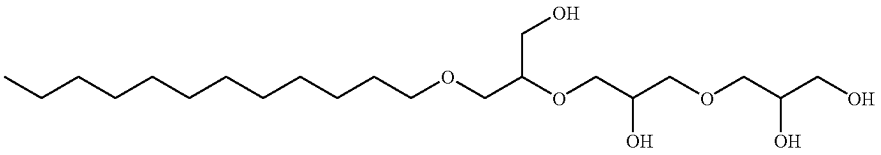
COM-V (3)
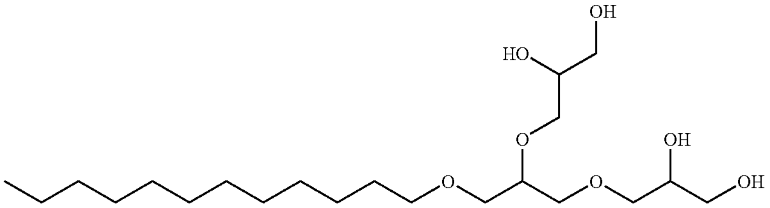
COM-V (4)
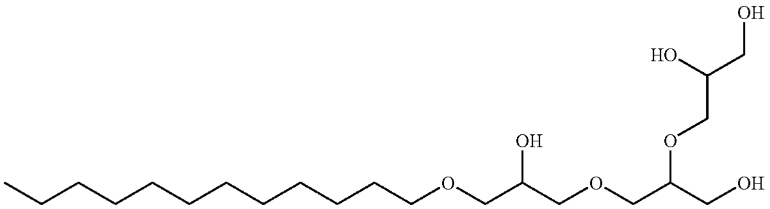
COM-V (5)
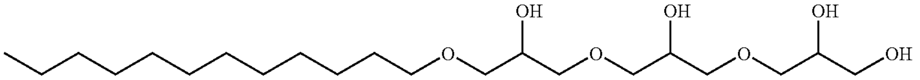
COM-VI
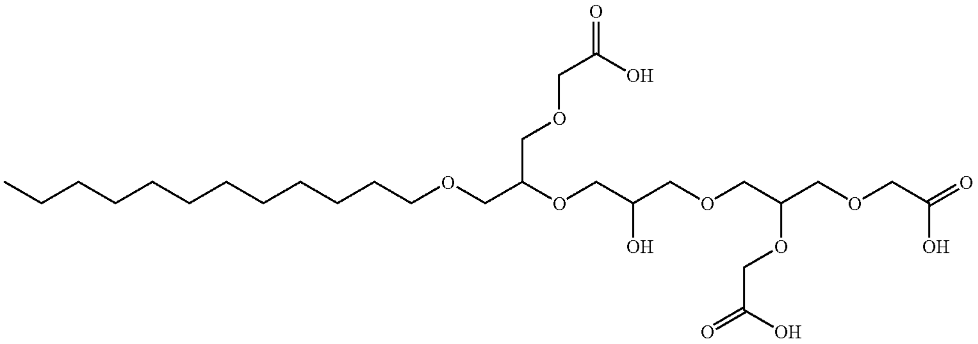
COM-VII
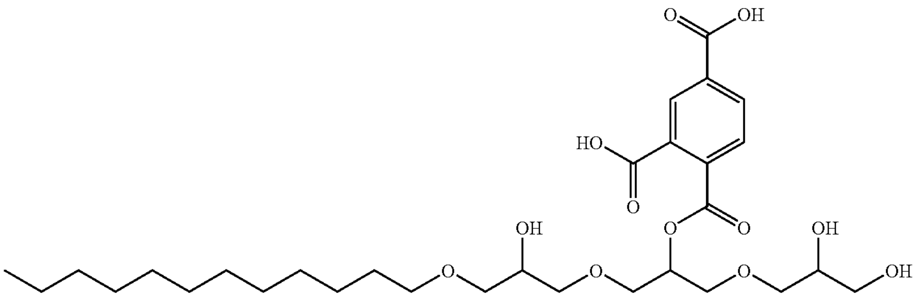
COM-VIII
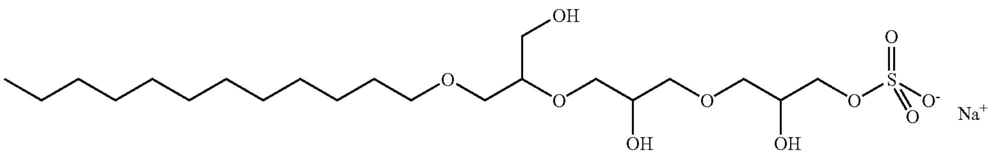

-continued

COM-IX

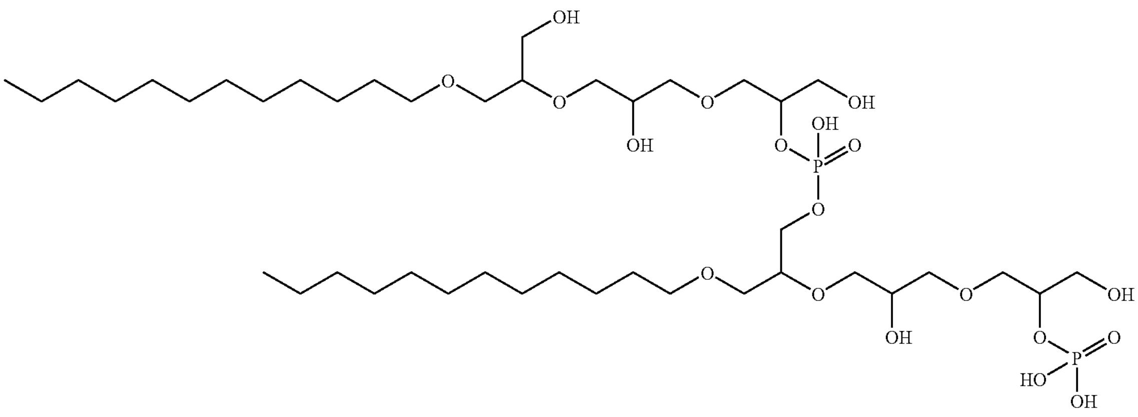

COM-X

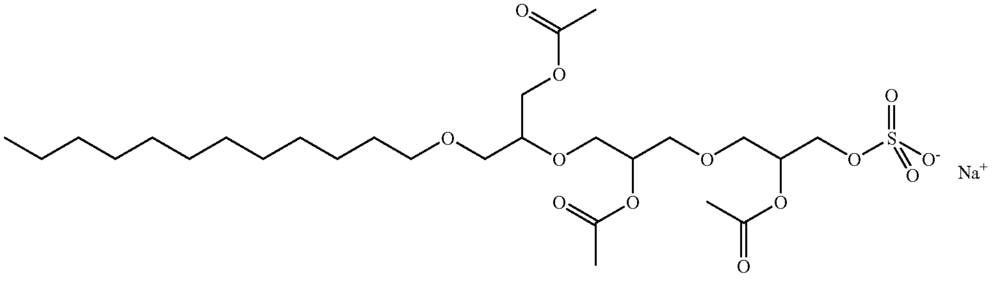

COM-XI

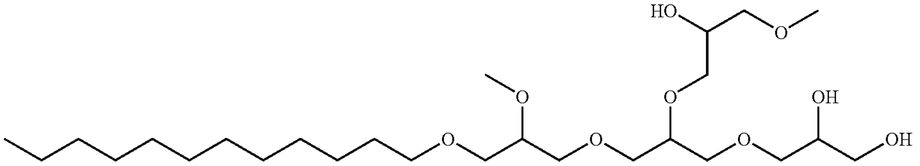

The liquids used in a method according to a preferred embodiment of the present invention are applied to a printing plate and are herein also referred to as plate treating liquids. The plate treating liquids may be applied before, after and during the printing step. The use of the plate treating liquids does not include the use as a fountain solution which is, in wet lithographic printing, supplied to the printing plate during the printing step.

The plate treating liquids according to preferred embodiments of the present invention include, depending on their specific mode of action, cleaning liquids, gumming liquids, protecting liquids, correcting liquids and conditioning liquids.

Cleaning liquids such as plate cleaners are generally used to remove ink and debris from the plate, to desensitize the non-image areas and to restore the hydrophilic properties of the non-image areas, which upon time may become less able to repel ink and may tend to retain some ink—known in the art as scumming. An efficient plate cleaner removes ink, dirt, oxidation spots, smudge and/or other imperfections without scratching or abrading the plate. The liquid can also be used to remove staining formed at any stage from plate-making through printing.

A gum solution or gumming liquid is typically an aqueous liquid, which is capable of protecting the lithographic image of a printing plate against contamination, environmental influences or damage and has preferably a pH from 1 to 11, more preferably from 4 to 10, most preferably from 5 to 8. Gumming liquids, also referred to as protecting liquids, ensure the hydrophilic characteristics of the non-image areas and/or the hydrophobic characteristics of the image areas of a printing plate during storage and/or protect these areas against contamination by deposits, flaw formation, oxidation and atmospheric attack. The so-called "wash-out gums" have the same properties as gumming liquids and are additionally capable of removing ink from the plate and cleaning the image and non-image areas as described in the former paragraph.

Correcting fluids are typically used to remove scratches, smudge and/or oxidation spots which may be present on the surface of the plate. These fluids are also used in the form of addition or deletion pens and/or gels to either add or remove image parts.

The treating liquid used in a preferred embodiment of the present invention can be an aqueous solution, an emulsion with an aqueous phase and a solvent phase, or can be solvent-based. The emulsion can be a macro or a micro-emulsion and a water-in-oil emulsion or an oil-in-water emulsion. Preferably the treating liquids include an aqueous phase and a solvent phase. The solvent phase in the emulsion preferably ranges from 0-90% wt, more preferably from 10-65% wt. The solvent phase typically includes one or more hydrophobic organic solvents such as for example aliphatic and/or aromatic hydrocarbons, a solvent-soluble surfactant and/or a vegetable oil and/or an ester thereof. The aqueous phase may optionally include a hydrophilizer such as sorbitol or glycerol, a chelating agent, a compound including at least one acid group such as for example phosphoric acid, citric acid, gluconic acid, glycolic acid or polyvinylphosphonic acid, a biocide, a corrosion inhibitor, an antifoaming agent, a desensitizing agent such as a nitrate salt and/or a water-soluble polymer with an excellent film forming ability such as polyvinyl alcohol, polyvinylpyrrolidone, partially hydrolyzed polyvinyl acetates, gelatin, gum arabic, various starches, carbohydrates or cellulose derivatives such as carboxymethyl cellulose, methyl or ethyl cellulose, hemicellulose, hydroxyethyl cellulose.

As known in the art other suitable additives may be present in the treating fluids and include for example buffers, pH adjusters like mineral acids, organic acids or inorganic salts, preservatives such as phenol and derivatives thereof, protective agents, dyes, colorants, thickening agents etc.

The treating liquids may be applied by for example wiping the printing plate with e.g., a cotton pad or sponge soaked with the treating liquid before and/or after mounting the plate on the press and also during and/or after the print run. The wiping may be combined with mechanical rubbing, e.g., by using a (rotating) brush. Alternatively, the treating liquid may be applied by spraying, dipping or coating it on to the printing plate. Various coating techniques, such as dip coating, spray coating, slot coating, reverse roll coating or electrochemical coating may be employed; most preferred is dip and spray coating. In case more than one liquid is applied via the coating technique, single pass processes are preferred since they facilitate the avoidance of contamination which could otherwise occur as a consequence of re-circulation of the liquid.

The lithographic printing plate used in a preferred embodiment of the present invention includes a support which has a hydrophilic surface or which is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate including an aluminum foil and a plastic layer, e.g., polyester film.

A particularly preferred lithographic support is an electrochemically grained and anodized aluminum support. The aluminum support has usually a thickness of about 0.1-0.6 mm. However, this thickness can be changed appropriately depending on the size of the printing plate used and/or the size of the plate-setters on which the printing plate precursors are exposed. The aluminum is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 μm. The aluminum substrate in a preferred embodiment of the present invention has preferably an Ra value below 0.45 μm, more preferably below 0.40 μm and most preferably below 0.30 μm. The lower limit of the Ra value is preferably about 0.1 μm. More details concerning the preferred Ra values of the surface of the grained and anodized aluminum support are described in EP 1 356 926.

By anodizing the aluminum support, its abrasion resistance and hydrophilic nature are improved. The microstructure as well as the thickness of the $Al_2O_3$ layer are determined by the anodizing step, the anodic weight (g/m$^2$ $Al_2O_3$ formed on the aluminum surface) varies between 1 and 8 g/m$^2$. The anodic weight is preferably $\geqq$3 g/m$^2$, more preferably $\geqq$3.5 g/m$^2$ and most preferably $\geqq$4.0 g/m$^2$.

An optimal ratio between pore diameter of the surface of the aluminum support and the average particle size of hydrophobic thermoplastic particles which may be provided thereon, may enhance the press life of the printing plate and may improve the toning behavior of the prints. This ratio of the average pore diameter of the surface of the aluminum support to the average particle size of the thermoplastic particles which may be present in the image-recording layer of the coating, preferably ranges from 0.05:1 to 1.0:1, more preferably from 0.10:1 to 0.80:1 and most preferably from 0.15:1 to 0.65:1.

The grained and anodized aluminum support may be subject to a so-called post-anodic treatment to improve the hydrophilic properties of its surface. For example, the aluminum support may be silicated by treating its surface with a sodium silicate solution at elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde.

Another useful post-anodic treatment may be carried out with a solution of polyacrylic acid or a polymer including at least 30 mol % of acrylic acid monomeric units, e.g., GLASCOL E15, a polyacrylic acid, commercially available from Ciba Specialty Chemicals.

The support can also be a flexible support, which may be provided with a hydrophilic layer, hereinafter called 'base layer'. The flexible support is e.g., paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in e.g., EP-A 1 025 992.

The lithographic printing plate used in a preferred embodiment of the present invention is obtained by exposing and optionally developing a printing plate precursor including a heat and/or light-sensitive coating on a hydrophilic support. The precursor can be negative or positive working, i.e., can form ink-accepting areas at exposed or at non-exposed areas respectively. Below, suitable examples of heat- and light-sensitive coatings are discussed in detail.

Heat-Sensitive Printing Plate Precursors

The imaging mechanism of thermal printing plate precursors can be triggered by direct exposure to heat, e.g., by means of a thermal head, or by the light absorption of one or more compounds in the coating that are capable of converting light, more preferably infrared light, into heat.

A first suitable example of a thermal printing plate precursor is a precursor based on heat-induced coalescence of hydrophobic thermoplastic polymer particles which are preferably dispersed in a hydrophilic binder, as described in e.g., EP 770 494, EP 770 495, EP 770 497, EP 773 112, EP 774 364, EP 849 090, EP 1 614 538, EP 1 614 539, EP 1 614 540, EP 1 777 067, EP 1 767 349, WO 2006/037716, WO 2006/133741 and WO 2007/045515.

Preferably such an image-recording layer includes an organic compound, characterized in that the organic compound includes at least one phosphoric acid group or at least one phosphoric acid group or a salt thereof, as described in WO 2007/04551.5. In a particularly preferred embodiment the image-recording layer includes an organic compound as represented by formula XVI:

Formula XVI

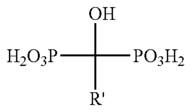

or a salt thereof and wherein R' independently represent hydrogen, an optionally substituted straight, branched, cyclic or heterocyclic alkyl group or an optionally substituted aryl or (hetero)aryl group.

Compounds according to Formula XVI may be present in the image-recording layer in an amount between 0.05 and 15% by weight, preferably between 0.5 and 10% by weight, more preferably between 1 and 5% by weight relative to the total weight of the ingredients of the image-recording layer.

In a second suitable preferred embodiment, the thermal printing plate precursor includes a coating including an aryldiazosulfonate homo- or copolymer which is hydrophilic and soluble in the processing liquid before exposure to heat or UV light and rendered hydrophobic and less soluble after such exposure.

Preferred examples of such aryldiazosulfonate polymers are the compounds which can be prepared by homo- or copolymerization of aryldiazosulfonate monomers with other aryldiazosulfonate monomers and/or with vinyl monomers such as (meth)acrylic acid or esters thereof, (meth)acrylamide, acrylonitrile, vinylacetate, vinylchloride, vinylidene chloride, styrene, α-methyl styrene etc. Suitable aryldiazosulfonate monomers are disclosed in EP-A 339393, EP-A 507008 and EP-A 771645 and suitable aryldiazosulfonate polymers are disclosed in EP 507,008, EP 960,729, EP 960,730 and EP1,267,211.

A further suitable thermal printing plate precursor is positive working and relies on heat-induced solubilization of an oleophilic resin. The oleophilic resin is preferably a polymer that is soluble in an aqueous developer, more preferably an aqueous alkaline developing solution with a pH between 7.5 and 14. Preferred polymers are phenolic resins e.g., novolac, resoles, polyvinyl phenols and carboxy substituted polymers. Typical examples of these polymers are described in DE-A-4007428, DE-A-4027301 and DE-A-4445820. The amount of phenolic resin present in the first layer is preferably at least 50% by weight, preferably at least 80% by weight relative to the total weight of all the components present in the first layer.

In a preferred embodiment, the oleophilic resin is preferably a phenolic resin wherein the phenyl group or the hydroxy group is chemically modified with an organic substituent. The phenolic resins which are chemically modified with an organic substituent may exhibit an increased chemical resistance against printing chemicals such as fountain solutions or plate treating liquids such as plate cleaners. Examples of such chemically modified phenolic resins are described in EP-A 0 934 822, EP-A 1 072 432, U.S. Pat. No. 5,641,608, EP-A 0 982 123, WO 99/01795, EP-A 02 102 446, EP-A 02 102 444, EP-A 02 102 445, EP-A 02 102 443, EP-A 03 102 522. The modified resins described in EP-A 02 102 446, are preferred, especially those resins wherein the phenyl-group of the phenolic resin is substituted with a group having the structure —N=N-Q, wherein the —N=N— group is covalently bound to a carbon atom of the phenyl group and wherein Q is an aromatic group.

In the latter preferred embodiment the coating may include a second layer that includes a polymer or copolymer (i.e., (co)polymer) including at least one monomeric unit that includes at least one sulfonamide group. This layer is located between the layer described above including the oleophilic resin and the hydrophilic support. Hereinafter, 'a (co)polymer including at least one monomeric unit that includes at least one sulfonamide group' is also referred to as "a sulphonamide (co)polymer". The sulphonamide (co)polymer is preferably alkali soluble. The sulphonamide group is preferably represented by —NR—$SO_2$—, —$SO_2$—NR— or —$SO_2$—NRR' wherein R and R' each independently represent hydrogen or an organic substituent.

Sulfonamide (co)polymers are preferably high molecular weight compounds prepared by homopolymerization of monomeric units containing at least one sulfonamide group or by copolymerization of such monomeric units and other polymerizable monomeric units.

Examples of monomeric units containing at least one sulfonamide group include monomeric units further containing at least one polymerizable unsaturated bond such as an acryloyl, allyl or vinyloxy group. Suitable examples are disclosed in U.S. Pat. No. 5,141,838, EP 1545878, EP 909,657, EP 0 894 622 and EP 1,120,246.

Examples of monomeric units copolymerized with the monomeric units containing at least one sulfonamide group include monomeric units as disclosed in EP 1,262,318, EP 1,275,498, EP 909,657, EP 1,120,246, EP 0 894 622 and EP 1,400,351.

Suitable examples of sulfonamide (co)polymers and/or their method of preparation are disclosed in EP-A 933 682, EP-A 982 123, EP-A 1 072 432, WO 99/63407 and EP 1,400,351.

A highly preferred example of a sulfonamide (co)polymer is a homopolymer or copolymer including a structural unit represented by the following general formula (XVII):

(XVII)

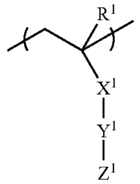

wherein:

$R^1$ represents hydrogen or a hydrocarbon group having up to 12 carbon atoms; preferably $R^1$ represents hydrogen or a methyl group;

$X^1$ represents a single bond or a divalent linking group. The divalent linking group may have up to 20 carbon atoms and may contain at least one atom selected from C, H, N, O and S.

Preferred divalent linking groups are a linear alkylene group having 1 to 18 carbon atoms, a linear, branched, or cyclic group having 3 to 18 carbon atoms, an alkynylene group having 2 to 18 carbon atoms and an arylene group having 6 to 20 atoms, —O—, —S—, —CO—, —CO—O—, —O—CO—, —CS—, —$NR^hR^i$—, —CO—$NR^h$—, —$NR^h$—CO—, —$NR^h$—CO—O—, —O—CO—$NR^h$—, —$NR^h$—CO—$NR^i$—, —$NR^h$—CS—$NR^i$—, a phenylene group, a naphtalene group, an anthracene group, a heterocyclic group, or combinations thereof, wherein $R^h$ and $R^i$ each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group. Preferably $X^1$ is a methylene group, an ethylene group, a propylene group, a butylene group, an isopropylene group, cyclohexylene group, a phenylene group, a tolylene group or a biphenylene group;

$Y^1$ is a bivalent sulphonamide group represented by —$NR^j$—$SO_2$— or —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group or a group of the formula —C(═N)—NH—$R^2$, wherein $R^2$ represents hydrogen or an optionally substituted alkyl or aryl group;

$Z^1$ represents a bi-, tri- or quadrivalent linking group or a terminal group. When $Z^2$ is a bi-, tri- or quadrivalent linking group, the remaining 1 to 3 bonds of $Z^1$ are linked to $Y^1$ forming crosslinked structural units.

When $Z^1$ is a terminal group, it is preferably represented by hydrogen or an optionally substituted linear, branched, or cyclic alkylene or alkyl group having 1 to 18 carbon atoms such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group, an octyl group, an optionally substituted arylene or aryl group having 6 to 20 carbon atoms; an optionally substituted hetero-arylene or heteroaryl group; a linear, branched, or cyclic alkenylene or alkenyl group having 2 to 18 carbon atoms, a linear, branched, or cyclic alkynylene or alkynyl group having 2 to 18 carbon atom or an alkoxy group.

When Z is a bi, tri- or quadrivalent linking group, it is preferably represented by an above mentioned terminal group of which hydrogen atoms in numbers corresponding to the valence are eliminated therefrom.

Examples of preferred substituents optionally present on the groups representing $Z^1$ are an alkyl group having up to 12 carbon atoms, an alkoxy group having up to 12 carbon atoms, a halogen atom or a hydroxyl group.

The structural unit represented by the general formula (XVII) has preferably the following groups:

$X^1$ represents an alkylene, cyclohexylene, phenylene or tolylene group, —O—, —S—, —CO—, —CO—O—, —O—CO—, —CS—, —$NR^hR^i$—, —CO—$NR^h$—, —$NR^h$—CO—, —$NR^h$—CO—O—, —O—CO—$NR^h$—, —$NR^h$—CO—$NR^i$—, —$NR^h$—CS—$NR^i$—, or combinations thereof, and wherein $R^h$ and $R^i$ each independently represent hydrogen or an optionally substituted alkyl, alkenyl, alkynyl, cycloalkyl, heterocyclic, aryl, heteroaryl, aralkyl or heteroaralkyl group. Preferred substituents on the latter groups are an alkoxy group having up to 12 carbon atoms, a halogen or a hydroxyl group;

$Y^1$ is a bivalent sulphonamide group represented by —$NR^j$—$SO_2$—, —$SO_2$—$NR^k$— wherein $R^j$ and $R^k$ each independently represent hydrogen, an optionally substituted alkyl, alkanoyl, alkenyl, alkynyl, cycloalkyl, heterocyclic, aryl, heteroaryl, aralkyl or heteroaralkyl group;

$Z^1$ is a terminal group represented by hydrogen, an alkyl group such as a methyl group, an ethyl group, a propyl group, an isopropyl group, a butyl group, an isobutyl group, a t-butyl group, a s-butyl group, a pentyl group, a hexyl group, a cyclopentyl group, a cyclohexyl group or an octyl group, a benzyl group, an optionally substituted aryl or heteroaryl group, a naphtyl group, an anthracenyl group, a pyridyl group, an allyl group or a vinyl group.

Specific preferred examples of sulphonamide (co)polymers are polymers including N-(p-aminosulfonylphenyl) (meth)acrylamide, N-(m-aminosulfonylphenyl) (meth)acrylamide and/or N-(o-aminosulfonylphenyl) (meth) acrylamide. A particularly preferred sulphonamide (co)polymer is a polymer including N-(p-aminosulphonylphenyl)methacrylamide wherein the sulphonamide group includes an optionally substituted straight, branched, cyclic or heterocyclic alkyl group, an optionally substituted aryl group or an optionally substituted heteroaryl group.

The layer including the sulphonamide (co)polymer may further include additional hydrophobic binders such as a phenolic resin (e.g., novolac, resoles or polyvinyl phenols), a chemically modified phenolic resin or a polymer containing a carboxyl group, a nitrile group or a maleimide group.

The dissolution behavior of the coating of the latter preferred embodiment in the developer can be fine-tuned by optional solubility regulating components. More particularly, development accelerators and development inhibitors can be used. In the preferred embodiment where the coating includes more than one layer, these ingredients can be added to the first layer, to the second layer and/or to an optional other layer of the coating.

Development accelerators are compounds which act as dissolution promoters because they are capable of increasing the dissolution rate of the coating. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydro-phthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3", 4"-tetrahydroxy-3,5,3',5'-tetramethyltriphenyl-methane, and the like. Examples of the organic acids include sulphonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulphonic acid, dodecylbenzenesulphonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole. Polymeric development accelerators such as phenolic-formaldehyde resins including at least 70 mol % meta-cresol as recurring monomeric units are also suitable development accelerators.

In a preferred embodiment, the coating also contains developer resistance means, also called development inhibitors, i.e., one or more ingredients which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g., EP-A 823 327 and WO97/39894 are believed to act as dissolution inhibitors due to interaction, e.g., by hydrogen bridge formation, with the alkali-soluble resin(s) in the coating. Inhibitors of this type typically include at least one hydrogen bridge forming group such as nitrogen atoms, onium groups, carbonyl (—CO—), sulfinyl (—SO—) or sulfonyl (—$SO_2$—) groups and a large hydrophobic moiety such as one or more aromatic rings. Some of the compounds mentioned below, e.g., infrared dyes such as cyanines and contrast dyes such as quaternized triarylmethane dyes can also act as a dissolution inhibitor.

Other suitable inhibitors improve the developer resistance because they delay the penetration of the aqueous alkaline developer into the coating. Such compounds can be present in the first layer and/or, if present, in the second layer as described in e.g., EP-A 950 518, and/or in a development barrier layer on top of the layer, as described in e.g., EP-A 864 420, EP-A 950 517, WO 99/21725 and WO 01/45958. In the latter preferred embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include the following:

(a) A polymeric material which is insoluble in or impenetrable by the developer, e.g., a hydrophobic or water-repellent polymer or copolymer such as acrylic polymers, polystyrene, styrene-acrylic copolymers, polyesters, polyamides, polyureas, polyurethanes, nitrocellulosics and epoxy resins; or polymers including siloxane (silicones) and/or perfluoroalkyl units.

(b) Bifunctional compounds such as surfactants including a polar group and a hydrophobic group such as a long chain hydrocarbon group, a poly- or oligosiloxane and/or a perfluorinated hydrocarbon group. A typical example is Megafac F-177, a perfluorinated surfactant available from Dainippon Ink & Chemicals, Inc. A suitable amount of such compounds is between 10 and 100 mg/$m^2$, more preferably between 50 and 90 mg/$m^2$.

(c) Bifunctional block-copolymers including a polar block such as a poly- or oligo(alkylene oxide) and a hydrophobic block such as a long chain hydrocarbon group, a poly- or oligosiloxane and/or a perfluorinated hydrocarbon group. A suitable amount of such compounds is between 0.5 and 25 mg/$m^2$, preferably between 0.5 and 15 mg/$m^2$ and most preferably between 0.5 and 10 mg/$m^2$. A suitable copolymer includes about 15 to 25 siloxane units and 50 to 70 alkyleneoxide groups. Preferred examples include copolymers including phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. The poly- or oligosiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the polymer or oligomer is at least 2, preferably at least 10, more preferably at least 20. It may be less than 100, preferably less than 60.

It is believed that during coating and drying, the above mentioned inhibitor of type (b) and (c) tends to position itself, due to its bifunctional structure, at the interface between the coating and air and thereby forms a separate top layer even when applied as an ingredient of the coating solution of the first and/or of the optional second layer. Simultaneously, the surfactants also act as a spreading agent which improves the coating quality. The separate top layer thus formed seems to be capable of acting as the above mentioned barrier layer which delays the penetration of the developer into the coating.

Alternatively, the inhibitor of type (a) to (c) can be applied in a separate solution, coated on top of the first, optional second and/or other layers of the coating. In that preferred embodiment, it may be advantageous to use a solvent in the separate solution that is not capable of dissolving the ingredients present in the other layers so that a highly concentrated water-repellent or hydrophobic phase is obtained at the top of the coating which is capable of acting as the above mentioned development barrier layer.

In addition, the first or optional second layer and/or other layer may include polymers that further improve the run length and/or the chemical resistance of the plate. Examples thereof are polymers including imido (—CO—NR—CO—) pendant groups, wherein R is hydrogen, optionally substituted alkyl or optionally substituted aryl, such as the polymers described in EP-A 894 622, EP-A 901 902, EP-A 933 682 and WO 99/63407.

The coating of the heat-sensitive printing plate precursors described above preferably also contains an infrared light absorbing dye or pigment which, in the preferred embodiment where the coating includes more than one layer, may be present in the first layer, and/or in the second layer, and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g., EP-As 823327, 978376, 1029667, 1053868, 1093934; WO 97/39894 and 00/29214. Preferred compounds are the following cyanine dyes:

IR-1

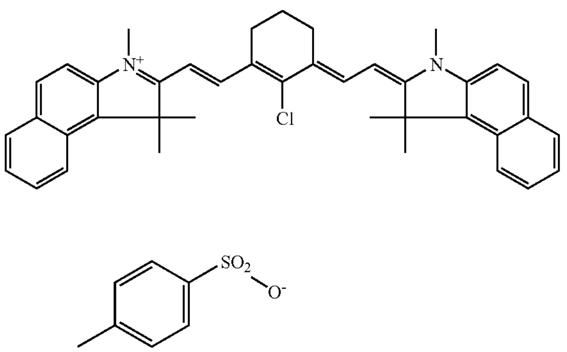

-continued

IR-2

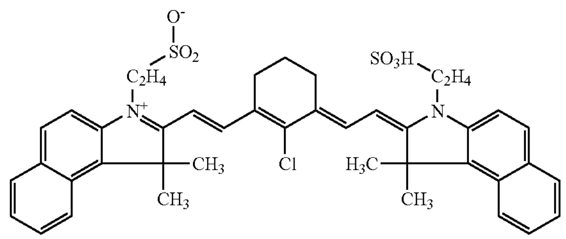

The concentration of the IR-dye in the coating is preferably between 0.25 and 15.0% wt, more preferably between 0.5 and 10.0% wt, most preferably between 1.0 and 7.5% wt relative to the coating as a whole.

The coating may further include one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g., crystal violet, methyl violet, victoria pure blue, flexoblau 630, basonylblau 640, auramine and malachite green. Also the dyes which are discussed in depth in EP-A 400,706 are suitable contrast dyes. Dyes which, combined with specific additives, only slightly color the coating but which become intensively colored after exposure, as described in for example WO2006/005688 may also be used as colorants.

The heat-sensitive plate precursor can be image-wise exposed directly with heat, e.g., by means of a thermal head, or indirectly by infrared light, preferably near infrared light. The infrared light is preferably converted into heat by an IR light absorbing compound as discussed above. The heat-sensitive lithographic printing plate precursor is preferably not sensitive to visible light, i.e., no substantial effect on the dissolution rate of the coating in the developer is induced by exposure to visible light. Most preferably, the coating is not sensitive to ambient daylight.

The printing plate precursor can be exposed to infrared light by means of e.g., LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 μm), the scan speed and the resolution of the exposure apparatus (i.e., the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g., from 0.1 to 10 m/sec. An XTD platesetter equipped with one or more laserdiodes emitting in the wavelength range between 750 and 850 nm is an especially preferred embodiment for the method of the present invention.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g., U.S. Pat. No. 5,174,205 and U.S. Pat. No. 5,163,368.

After exposure, the precursor can be developed by means of a suitable processing liquid, such as an aqueous alkaline solution, whereby the non-image areas of the coating are removed; the development step may be combined with mechanical rubbing, e.g., by using a rotating brush. During development, any water-soluble protective layer present is also removed. The heat-sensitive printing plate precursors based on latex coalescence, can also be developed using plain water or aqueous solutions, e.g., a gumming solution as described in EP 1,342,568. Alternatively, such printing plate precursors can after exposure directly be mounted on a printing press and be developed on-press by supplying ink and/or fountain to the precursor.

More details concerning the development step can be found in for example EP 1614538, EP 1614539, EP 1614540 and WO/2004071767.

Light-Sensitive Printing Plate Precursors

In addition to the above thermal materials, also light-sensitive coatings can be used. Typical examples of such plates are the UV-sensitive "PS" plates and the so-called photopolymer plates which contain a photopolymerizable composition that hardens upon exposure to light.

In a particular preferred embodiment of the present invention, a conventional, UV-sensitive "PS" plate precursor is used. Suitable examples of such plates precursors, that are sensitive in the range of 300-450 nm (near UV and blue light), have been discussed in EP 1,029,668 A2. Positive and negative working compositions are typically used in "PS" plate precursors.

The positive working imaging layer preferably includes an o-naphthoquinonediazide compound (NQD) and an alkali soluble resin. Particularly preferred are o-naphthoquinone-diazidosulphonic acid esters or o-naphthoquinone diazidocarboxylic acid esters of various hydroxyl compounds and o-naphthoquinone-diazidosulphonic acid amides or o-naphthoquinone-diazidocarboxylic acid amides of various aromatic amine compounds. Two variants of NQD systems can be used: one-component systems and two-component systems. Such light-sensitive printing plates have been widely disclosed in the prior art, for example in U.S. Pat. No. 3,635,709, J.P. KOKAI No. 55-76346, J.P. KOKAI No. Sho 50-117503, J.P. KOKAI No. Sho 50-113305, U.S. Pat. No. 3,859,099; U.S. Pat. No. 3,759,711; GB-A 739654, U.S. Pat. No. 4,266,001 and J.P. KOKAI No. 55-57841.

The negative working layer of a "PS" plate preferably includes a diazonium salt, a diazonium resin or an aryldiazosulfonate homo- or copolymer. Suitable examples of low-molecular weight diazonium salts include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde. Examples of diazo resins include condensation products of an aromatic diazonium salt as the light-sensitive substance. Such condensation products are described, for example, in DE-P-1 214 086. The light- or heat-sensitive layer preferably also contains a binder e.g., polyvinyl alcohol.

Upon exposure the diazo resins or diazonium salts are converted from water soluble to water insoluble (due to the destruction of the diazonium groups) and additionally the photolysis products of the diazo may increase the level of crosslinking of the polymeric binder or diazo resin, thereby selectively converting the coating, in an image pattern, from water soluble to water insoluble. The unexposed areas remain unchanged, i.e., water-soluble.

Such printing plate precursors can be developed using an aqueous alkaline solution as described above.

In a second suitable preferred embodiment, the light sensitive printing plate precursor is based on a photo-polymerization reaction and contains a coating including a photocurable composition including a free radical initiator (as disclosed in for example U.S. Pat. No. 5,955,238; U.S. Pat. No. 6,037,098; U.S. Pat. No. 5,629,354; U.S. Pat. No. 6,232,038; U.S. Pat. No. 6,218,076; U.S. Pat. No. 5,955,238; U.S. Pat. No. 6,037,098; U.S. Pat. No. 6,010,824; U.S. Pat. No. 5,629,354; DE 1,470,154; EP 024,629; EP 107,792; U.S. Pat. No. 4,410,621; EP 215,453; DE 3,211,312 and EP A 1,091,247) a polymerizable compound (as disclosed in EP1,161,4541, EP 1349006, WO2005/109103 and unpublished European patent applications EP 5,111,012.0, EP 5,111,025.2, EP 5110918.9 and EP 5, 110,961.9) and a polymeric binder (as disclosed in for example US2004/0260050, US2005/0003285; US2005/0123853; EP 1,369,232; EP 1,369,231; EP 1,341,040; US 2003/0124460, EP 1 241 002, EP 1 288 720, U.S. Pat. No. 6,027,857, U.S. Pat. No. 6,171,735; U.S. Pat. No. 6,420,089; EP 152,819; EP 1,043, 627; U.S. Pat. No. 6,899,994; US2004/0260050; US 2005/0003285; US2005/0170286; US2005/0123853; US2004/0260050; US2005/0003285; US 2004/0260050; US 2005/0003285; US 2005/0123853 and US2005/0123853). Other ingredients such as sensitizers, co-initiators, adhesion promoting compounds, colorants, surfactants and/or printing out agents may optionally be added. These printing plate precursors can be sensitized with blue, green or red light (i.e., wavelength range between 450 and 750 nm), with violet light (i.e., wavelength range between 350 and 450 nm) or with infrared light (i.e., wavelength range between 750 and 1500 nm) using for example an Ar laser (488 nm) or a FD-YAG laser (532 nm), a semiconductor laser InGaN (350 to 450 nm), an infrared laser diode (830 nm) or a Nd-YAG laser (1064 nm).

Typically, a photopolymer plate precursor is processed in alkaline developer having a pH>10 (see above) and subsequently gummed. Alternatively, the exposed photopolymer plate precursor can also be developed by applying a gum solution to the coating whereby the non-exposed areas are removed. Suitable gumming solutions are described in WO/2005/111727. After the exposure step, the imaged precursor can also be directly mounted on a press and processed on-press by applying ink and/or fountain solution. Methods for preparing such plates are disclosed in WO 93/05446, U.S. Pat. No. 6,027,857, U.S. Pat. No. 6,171,735, U.S. Pat. No. 6,420,089, U.S. Pat. No. 6,071,675, U.S. Pat. No. 6,245,481, U.S. Pat. No. 6,387,595, U.S. Pat. No. 6,482,571, U.S. Pat. No. 6,576,401, U.S. Pat. No. 6,548,222, WO 03/087939, US 2003/16577 and US 2004/13968.

To protect the surface of the coating of the heat and/or light sensitive printing plate precursors, in particular from mechanical damage, a protective layer may also optionally be applied. The protective layer generally includes at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e., less than 5% by weight based on the total weight of the coating solvents for the protective layer—of organic solvents. The thickness of the protective layer can suitably be any amount, advantageously up to 5.0 μm, preferably from 0.1 to 3.0 μm, particularly preferably from 0.15 to 1.0 μm.

Optionally, the coating may further contain additional ingredients such as surfactants, especially perfluoro surfactants, silicon or titanium dioxide particles or polymers particles such as matting agents and spacers.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The heat and/or light sensitive printing plates can be treated with the treating liquid according to preferred embodiments of the present invention. Than, they can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink includes an ink phase, also called the hydrophobic or oleophilic phase, and a polyol phase as described in WO 00/32705. Also during the printing step the treating liquid according to a preferred embodiment of the present invention can be applied to the printing plates.

The treating liquid used in a preferred embodiment of the present invention can also be used for treating thermo-resists, for example on a PCB (printed circuit board) application as described in US 2003/0003406 A1.

EXAMPLES

Example 1

The surfactants listed in Table 1 were added to demineralized water and to EXXOL D60 (trademark of Exxon) at a concentration of 4% wt. The mixtures were stirred for 5 minutes.

Subsequently, an Agfa Thermostar P970 plate (novolak-based printing plate precursor, commercially available from Agfa-Graphics NV) was developed in an AUTOLITH TP85 processor (trademark of Agfa-Graphics NV) filled with ENERGY DEVELOPER (trademark of Agfa-Graphics NV)

at 25° C. and with a dwell time in the developer section of 22 seconds, and then gummed with RC795 finisher (trademark of Agfa-Graphics NV).

Strips of the obtained plate were partly dipped in pure surfactant and in the solutions defined in Table 1, for respectively 1 hour and 24 hours.

After the dipping period, the dipped part of the strips was evaluated visually for possible chemical attack and/or coating loss.

The results are summarized in Table 2 (4% wt in $H_2O$), Table 3 (4% wt in Exxol D60) and Table 4 (pure surfactant).

TABLE 1

Surfactants

| Surfactant | Hydrophilic part* | Hydophobic part | HLB** |
|---|---|---|---|
| Synperonic 13/6.5 (1) comparative | 6.5 EO units | branched C13 alkyl | 12.5 |
| Synperonic 13/3 (2) comparative | 3 EO units | branched C13 alkyl | 8.6 |
| Synperonic 13/12 (3) comparative | 12 EO units | branched C13 alkyl | 14.8 |
| Synperonic A11 (4) comparative | 11 EO units | linear C12-C15 alkyl | 13.9 |
| Synperonic 91/6 (5) comparative | 6 EO units | linear C9-C11 alkyl | 12.5 |
| Hedipin R050 (6) comparative | 5 EO units | castor oil alkyl | 4.0 |
| Imbentin POA/020 (7) comparative | 2 EO units | C16-C18 alkyl | 5.0 |
| Berol 09 (8) comparative | 9 EO units | p-nonylphenol | 13.3 |
| PG AL ML-10 (9) Inventive | 10 glycerol units | C12 alkyl | 16.35 |
| PG AL ML-08 (10) Inventive | 8 glycerol units | C12 alkyl | 15.65 |
| PG AL ML-06 (11) Inventive | 6 glycerol units | C12 alkyl | 14.63 |
| PG AL ML-04 (12) Inventive | 4 glycerol units | C12 alkyl | 12.98 |
| PG AL ML-02 (13) Inventive | 2 glycerol units | C12 alkyl | 9.87 |
| PGLE ML 10 (14) Inventive | 10 glycerol units | lauric acid | 15.74 |
| Dehymuls PGPH (15) Inventive | Polyglycerol | poly-12-hydroxystearic acid | not available |
| Surfactant 10G (16) Inventive | 10 glycerol units | p-nonylphenol | 15.6 |
| Lameform TGI (17) Inventive | 3 glycerol units | isostearic acid (2x) | not available |

*EO: ethylene oxide;

**HLB: hydrophilic-lipophilic balance (1) to (5): surfactants commercially available from Uniqema;

(6) to (7): surfactants commercially available from Kolb AG (Switzerland);

(8): surfactant commercially available from Akzo Nobel Surface Chemistry (Sweden);

(9) to (14): surfactants commercially available from Daicel Chemical Industries Ltd. (Japan);

(15): surfactant commercially available from Cognis with the following chemical structure:

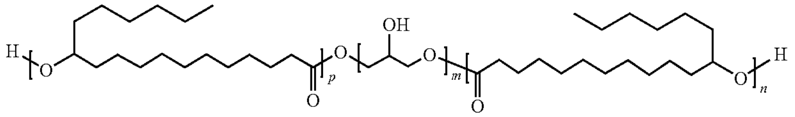

(16): surfactant commercially available from Arch Chemicals Inc. (USA);

(17): triglycerine diisostearate or polyglyceryl-3diisostearate surfactant commercially available from Cognis.

TABLE 2

4% wt Surfactant Solution in Water

| Surfactant (1) | chemical attack (2); after 1 hour of contact | chemical attack (2); after 24 hours of contact |
|---|---|---|
| Synperonic 13/6.5 comparative | 2 | 4 |
| Synperonic 13/3 comparative | 2 | 4 |

TABLE 2-continued

4% wt Surfactant Solution in Water

| Surfactant (1) | chemical attack (2); after 1 hour of contact | chemical attack (2); after 24 hours of contact |
|---|---|---|
| Synperonic 13/12 comparative | 1 | 4 |
| Synperonic A11 comparative | 2 | 4 |
| Synperonic 91/6 comparative | 1 | 4 |
| Hedipin R050 comparative | 1 | 3 |
| Imbentin POA/020 comparative | 2 | 3 |
| Berol 09 comparative | 2 | 4 |
| PG AL ML-10 inventive | 1 | 1 |
| PG AL ML-08 inventive | 1 | 1 |
| PG AL ML-06 inventive | 1 | 1 |
| PG AL ML-04 inventive | 1 | 1 |
| PG AL ML-02 inventive | 1 | 1 |
| PGLE ML 10 inventive | 1 | 1 |
| Dehymuls PGPH inventive | 1 | 1 |
| Surfactant 10G inventive | 1 | 1 |
| Lameform TGI Inventive | 1 | 1 |

(1) surfactants as defined in Table 1;
(2) qualitative evaluation scale: 1: no chemical attack; 2: low-level chemical attack; 3: high-level chemical attack; 4: complete coating loss.

TABLE 3

4% wt Surfactant Solution in Exxol D60

| Surfactant (1) | chemical attack (2) after 1 hour of contact | Chemical attack (2) after 24 hours of contact |
|---|---|---|
| Synperonic 13/6.5 Comparative | 2 | 4 |
| Synperonic 13/3 Comparative | 2 | 4 |
| Synperonic 13/12 Comparative | 1 | 4 |
| Synperonic A11 Comparative | 2 | 4 |
| Synperonic 91/6 Comparative | 1 | 4 |
| Hedipin R050 Comparative | 1 | 3 |
| Imbentin POA/020 Comparative | 2 | 3 |
| Berol 09 Comparative | 2 | 4 |
| PG AL ML-10 Inventive | 1 | 1 |
| PG AL ML-08 Inventive | 1 | 1 |
| PG AL ML-06 Inventive | 1 | 1 |
| PG AL ML-04 Inventive | 1 | 1 |
| PG AL ML-02 Inventive | 1 | 1 |
| PGLE ML 10 Inventive | 1 | 1 |
| Dehymuls PGPH Inventive | 1 | 1 |
| Surfactant 10G Inventive | 1 | 1 |

TABLE 3-continued

4% wt Surfactant Solution in Exxol D60

| Surfactant (1) | chemical attack (2) after 1 hour of contact | Chemical attack (2) after 24 hours of contact |
|---|---|---|
| Lameform TGI Inventive | 1 | 1 |

(1) surfactants as defined in Table 1;
(2) qualitative evaluation scale: 1: no chem. attack; 2: low-level chem. attack; 3: high-level chem. attack; 4: complete coating loss.

TABLE 4

Results Obtained with Pure Surfactant

| Surfactant (1) | chemical attack (2); after 1 hour of contact | chemical attack (2); after 24 hours of contact |
|---|---|---|
| Synperonic 13/6.5 Comparative | 2 | 4 |
| Synperonic 13/3 Comparative | 1 | 4 |
| Synperonic 13/12 Comparative | 1 | 4 |
| Synperonic A11 Comparative | not tested as the pure surfactant is a powder | |
| Synperonic 91/6 Comparative | 1 | 4 |
| Hedipin R050 Comparative | 1 | 4 |
| Imbentin POA/020 Comparative | 2 | 3 |
| Berol 09 Comparative | 2 | 4 |
| PG AL ML-10 Inventive | 1 | 1 |
| PG AL ML-08 Inventive | 1 | 1 |
| PG AL ML-06 Inventive | 1 | 1 |
| PG AL ML-04 Inventive | 1 | 1 |
| PG AL ML-02 Inventive | 1 | 1 |
| PGLE ML 10 Inventive | 1 | 1 |
| Dehymuls PGPH Inventive | 1 | 1 |
| Surfactant 10G Inventive | 1 | 1 |
| Lameform TGI Inventive | 1 | 1 |

(1) surfactants as defined in Table 1;
(2) qualitative evaluation scale: 1: no chem. attack; 2: low-level chem. attack; 3: high-level chem. attack; 4: complete coating loss.

The results in Tables 2 to 4 show that surfactants with a polyglycerol hydrophilic part, i.e., the inventive surfactants, are completely "plate safe" while the comparative surfactants severely damage the image areas of the printing plate by chemical attack.

Example 2

Two neutral plate cleaners PC-01 (comparative) and PC-02 (inventive) with the composition as given in Table 5 were prepared as follows:

(1) The components of the aqueous part, except for Rheogel IRX55395, were added to demineralized water at room temperature and these mixtures were stirred until all components were completely dissolved.
In the case of plate cleaner PC-02 the aqueous part was slightly warmed up (40° C.) during stirring.

(2) The components of the organic part were added to SHELLSOLL D60 (trademark of Shell) at room temperature and these mixtures were stirred until all components were completely dissolved.

(3) While stirring the aqueous part at @ 20K revolutions/minute in an ULTRA TURRAX T25 digital mixer equipped with a S25N mixing head (both trademarks and commercially available from IKA Werke GmbH & Co), the organic part was very slowly added. After complete addition of the organic part, the resulting emulsion was stirred for an additional 2 minutes at the same speed.

(4) Finally, Rheogel IRX55395 was added to this emulsion and the resulting plate cleaner was stirred for an additional 15 minutes using a stirrer RW20 (trademark and commercially available from IKA Werke GmbH & Co) equipped with a dispersion disk R1303 (trademark and commercially available from IKA Werke GmbH & Co).

TABLE 5

Composition of the Plate Cleaners PC-01 and PC-02

| Plate cleaner | PC-01, comparative example g | PC-02, inventive example g |
|---|---|---|
| Aqueous part | | |
| DW (1) | 100 | 300 |
| Parmetol A26 (2) | 0.2 | 0.6 |
| PG AL ML-08 (3) | — | 1.5 |
| Synperonic 13/3 (4) | 3 | — |
| Sorbitol (5) | 20 | 60 |
| Rheogel IRX55395 (6) | 0.5 | 1.5 |
| Total aqueous part | 123.7 | 363.6 |
| Organic part | | |
| Shellsol D60 (7) | 30 | 90 |
| Isopropyl laurate | 10 | 30 |
| Lameform TGI (8) | — | 9 |
| Total organic part | 40 | 129 |

(1) deionized water;
(2) Biocide commercially available from Schülke & Mayr GmbH, Germany;
(3) Inventive surfactant as defined in Table 1;
(4) Comparative surfactant as defined in Table 1;
(5) 50% Solution of sorbitol from Roquette Frères SA, France, with the following structure:

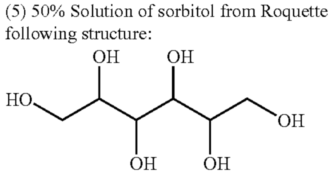

(6) Xhantangum thickener, commercially available from CNI SA, France.;
(7) Solvent commercially available from Shell;
(8) Inventive surfactant as defined in Table 1.

A strip of Agfa Thermostar P970 plate was first developed in an AUTOLITH TP85 processor (trademark from Agfa Graphics NV) filled with Energy Developer (commercially available from Agfa Graphics NV) at 25° C. and with a dwell time in the developer section of 22 seconds, and then gummed with RC795 finisher (commercially available from Agfa Graphics NV).

Subsequently, the strips were partially dipped for 24 hours in the plate cleaners PC-01 and PC-02.

Afterwards, the dipped part was evaluated visually for possible chemical attack/coating loss. The results are given in Table 6.

TABLE 6

Results of Chemical Attack

| Plate cleaner | PC-01, comparative example | PC-02, inventive example |
|---|---|---|
| chemical attack after 24 hours of contact* | 4 | 1 |

*qualitative evaluation scale: 1: no chemical attack; 2: low-level chemical attack; 3: high-level chemical attack; 4: complete coating loss.

These results show that the plate cleaner containing the polyglycerol containing surfactants is completely "plate safe" whereas the plate cleaner containing a surfactant of the prior art severely attacks the coating.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for treating a heat-sensitive lithographic printing plate comprising the steps of:

obtaining a printing plate by exposing to infrared light and developing a printing plate precursor including a coating including an infrared absorbing compound and an oleophilic resin which is soluble in an aqueous alkaline developer; and applying a liquid containing a surfactant to the printing plate, and the step of applying the liquid to the printing plate does not include applying the liquid as a fountain solution; wherein the surfactant includes at least one hydrophilic segment including polyglycerol, and at least one hydrophobic segment selected from an optionally substituted alkylene group, an alkyl or aryl substituted poly(meth)acrylate, an optionally substituted polyester, polyether, polyurethane, polycarbosilane, polysiloxane, polystyrene and/or a polymer including a perfluoroalkyl group; and the liquid does not chemically attack image areas on the printing plate.

2. The method according to claim 1, wherein the polyglycerol includes at least two units independently selected from:

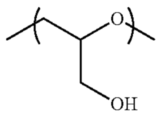

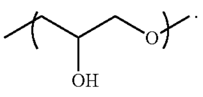

3. The method according to claim 1, wherein the hydrophobic segment is represented by an optionally substituted alkylene group.

4. The method according to claim 1, wherein the hydrophilic segment and the hydrophobic segment are linked via a spacer group selected from an ester, an ether, an urethane, an amide, a carbonate, a sulfonamide, an amine, and a thioether group.

5. The method according to claim 4, wherein the surfactant is an optionally substituted alkyl polyglycerol ester or an optionally substituted alkyl polyglycerol ether.

6. The method according to claim 5, wherein the surfactant is selected from polyglycerol lauryl ester, polyglycerol lauryl ether, triglycerine diisostearate, polyglycerol dilauryl ester, and polyglycerol-poly-12-hydroxystearic ester.

7. The method according to claim 1, wherein the oleophilic resin is a phenolic resin selected from a novolac resin, a resol resin, a polyvinylphenol, or a carboxy substituted polymer.

8. The method according to claim 1, wherein the image areas on the printing plate are unaffected by the liquid.

* * * * *